(12) United States Patent
Li et al.

(10) Patent No.: US 9,659,924 B2
(45) Date of Patent: May 23, 2017

(54) SIGNAL RECEIVING CIRCUIT AND SIGNAL TRANSCEIVING CIRCUIT

(71) Applicant: MEDIATEK INC., Hsin-Chu (TW)

(72) Inventors: Hsin-Hsien Li, Hsinchu (TW); Sheng-Fu Hsu, Hsinchu (TW); Hao-Shun Chang, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 132 days.

(21) Appl. No.: 14/287,056

(22) Filed: May 25, 2014

(65) Prior Publication Data
US 2015/0340359 A1 Nov. 26, 2015

(51) Int. Cl.
*H02H 3/22* (2006.01)
*H01L 27/02* (2006.01)
*H02H 9/04* (2006.01)

(52) U.S. Cl.
CPC ...... *H01L 27/0266* (2013.01); *H01L 27/0248* (2013.01); *H01L 27/0255* (2013.01); *H02H 9/046* (2013.01)

(58) Field of Classification Search
USPC .......................................... 361/56, 91.1, 111
See application file for complete search history.

(56) References Cited

U.S. PATENT DOCUMENTS

| | | | | |
|---|---|---|---|---|
| 4,868,705 A | * | 9/1989 | Shiochi | H01L 27/0251 257/357 |
| 5,034,845 A | * | 7/1991 | Murakami | H02H 9/046 361/111 |
| 6,738,248 B1 | * | 5/2004 | Jenkins | H01L 27/0255 361/111 |
| 2004/0021999 A1 | * | 2/2004 | Yamaguchi | H01L 27/0255 361/56 |
| 2005/0017796 A1 | * | 1/2005 | Tanizawa | H03F 1/523 327/562 |
| 2009/0052099 A1 | | 2/2009 | Chee | |
| 2010/0067154 A1 | | 3/2010 | Deng | |
| 2010/0296213 A1 | | 11/2010 | Lee | |
| 2011/0291758 A1 | * | 12/2011 | Hsieh | H03K 5/2481 330/253 |

OTHER PUBLICATIONS

J. Lepkowski et al., EMI/ESD protection solutions for the CAN bus, CAN in Automation, 2005, pp. 02-16-02-24, XP055214094.
B D DE et al., Bus-Polarity Correcting RS-485 Transceiver With IEC-ESD Protection, Texas Instruments, Jul. 14, 2013, pp. 1-17 with Packaging Information, Mechanical Data, Land Pattern Data and Important Notice, SN65HVD888, XP055214098, Texas Instruments Incorporated, www.ti.com.
Hein Marais, R5-485/RS-422 Circuit Implementation Guide, Analog Devices, 2008, pp. 1-12, AN-960 Application Note. XP055214100, Analog Devices, Inc., www.analog.com.

* cited by examiner

*Primary Examiner* — Danny Nguyen
(74) *Attorney, Agent, or Firm* — Winston Hsu; Scott Margo

(57) ABSTRACT

A signal transceiving circuit comprising an IC including a signal transmitting part. The signal transmitting part comprises: a first I/O pad; a second I/O pad; a first output stage circuit, coupled to the first I/O pad; a second output stage circuit, coupled to the second I/O pad; and a first surge protecting device, comprising a first terminal coupled to the first output stage circuit and the first I/O pad, and comprising a second terminal coupled to the second output stage circuit and the second I/O pad.

20 Claims, 6 Drawing Sheets

SIGNAL RECEIVING CIRCUIT AND SIGNAL TRANSCEIVING CIRCUIT

BACKGROUND

In a related art, a surge protecting device is always provided to an IC to prevent the IC from being damaged by a surge voltage. The surge voltage is generated by a surge signal transmitted from a web line or a circuit line, which always has a lower frequency than an ESD (ElectroStatic Discharge) signal. Therefore, a traditional ESD protecting device can not protect the IC from being damaged by the surge voltage.

FIG. 1 is a circuit diagram illustrating a related art surge protecting mechanism. As shown in FIG. 1, an IC (integrated circuit) 101 is provided on a board 100. A surge protecting device 105 is provided in a hybrid circuit near the IC 101. The hybrid circuit comprises a transformer 103, the surge protecting device 105, a resistance network comprising resistance devices $R_a$, $R_b$, $R_c$, $R_d$, $R_e$, $R_f$, a transmitter 107 and a receiver 109. The transmitter 107 and a receiver 109 are provided inside the IC 101 (but also can outside the IC) and other devices for the hybrid circuit are outside the IC 101. If a surge voltage $V_{sr}$ occurs, it is reduced by the primary side and the secondary side of the transformer 103, and then released by the surge protecting device 105. The surge protecting device 105 can comprises various kinds of structures. For example, it can comprise zener diodes $D_1$, $D_2$, $D_3$ and $D_4$ as shown in FIG. 1.

However, as shown in FIG. 1, the surge protecting device 105 is provided on the board 100, thus the space for the board 100 is occupied and the cost increases.

SUMMARY

Therefore, one objective of the present application is to provide a signal receiving circuit having a surge protecting device provided in the IC or near the IC.

Another objective of the present application is to provide a signal receiving circuit having a surge protecting device provided in the IC or near the IC.

One embodiment of the present application discloses a signal transceiving circuit comprising an IC including a signal transmitting part. The signal transmitting part comprises: a first I/O pad; a second I/O pad; a first output stage circuit, coupled to the first I/O pad; a second output stage circuit, coupled to the second I/O pad; and a first surge protecting device, comprising a first terminal coupled to the first output stage circuit and the first I/O pad, and comprising a second terminal coupled to the second output stage circuit and the second I/O pad.

The signal transceiving circuit can further comprising a second surge protecting device, wherein the IC further comprises an internal circuit and a first ESD protecting device, where the second surge protecting device, the internal circuit and the first ESD protecting device form a signal receiving part. If a surge voltage occurs, the second surge protecting device receives and processes the surge voltage first to generate a processed surge voltage, and then the first ESD protecting device receives and processes the processed surge voltage.

The signal transmitting part and the signal receiving part can be provided in different ICs. In such case, the signal transmitting part and the signal receiving part can be regarded as a signal transmitting circuit and a signal receiving circuit which are independent from each other.

In view of above-mentioned embodiments, the surge protecting device having small sizes can be provided inside the IC or near the IC. Therefore, the issue for occupying board region can be avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
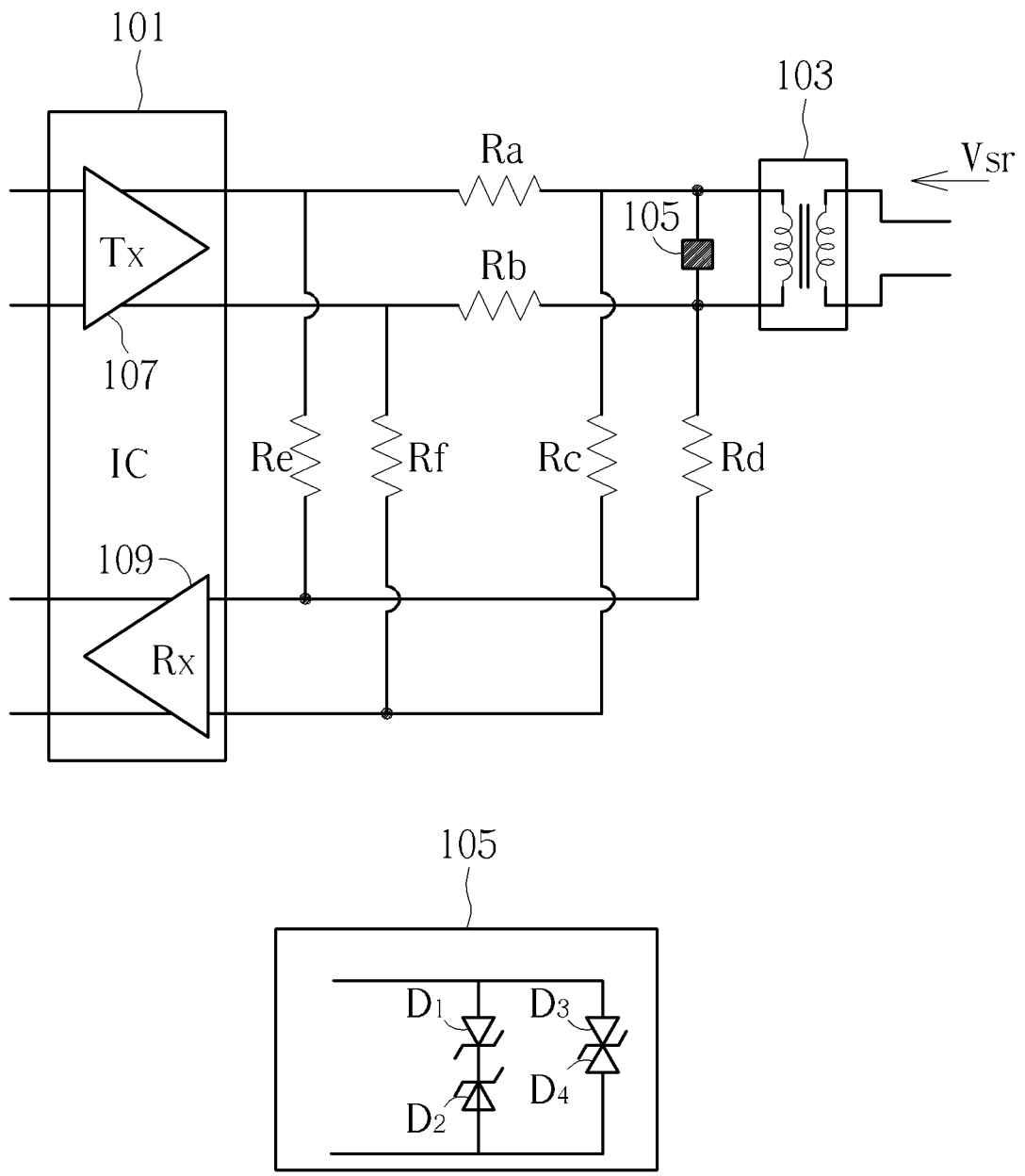
FIG. 1 is a circuit diagram illustrating a related art surge protecting mechanism.
Figure 2:
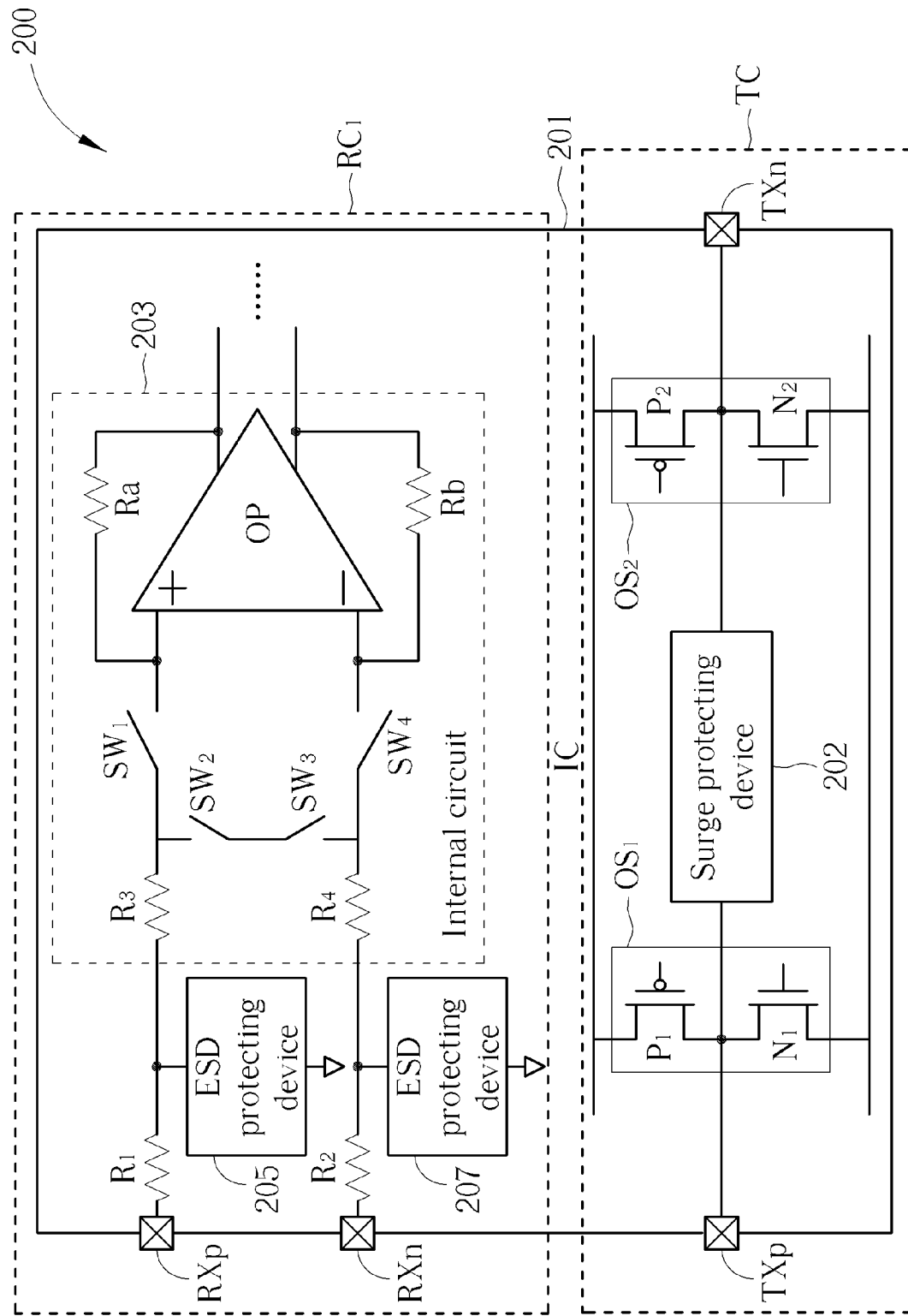
FIG. 2 is a circuit diagram illustrating signal transceiving circuits according to an embodiment of the present application.

FIG. 2 is a circuit diagram illustrating signal transceiving circuits according to an embodiment of the present application.

In FIG. 2, the signal transceiving circuit 200 comprises an IC 201 comprising a signal receiving part $RC_1$ and a signal transmitting part TC. The signal transmitting part TC comprises I/O pads $TX_p$, $TX_n$, output stage circuits $OS_1$, $OS_2$, and a surge protecting device 202. The output stage circuit $OS_1$ is coupled to the I/O pad $TX_p$. The output stage circuit $OS_2$ is coupled to the I/O pad $TX_n$. The surge protecting device 202 comprises a first terminal coupled to the output stage circuit $OS_1$ and the I/O pad $TX_p$, and comprises a second terminal coupled to the output stage circuit $OS_2$ and the I/O pad $TX_n$. Please note the signal receiving part $RC_1$ and the signal transmitting part TC are not limited to be included in a single IC, it can be provide in different ICs. In such cases, the signal receiving part is an independent signal receiving circuit and the signal transmitting part is a signal transmitting circuit.

In one embodiment, the output stage circuit $OS_1$ and the output stage circuit $OS_2$ are output buffers. The output buffer can comprise various kinds of structures. In one embodiment, the output stage circuit $OS_1$ comprises: a PMOSFET $P_1$ comprising a first terminal coupled to a first predetermined voltage level $V_{DD}$ and comprising a second terminal coupled to the first terminal of the surge protecting device 203; and a NMOSFET $N_1$ comprising a first terminal coupled to the second terminal of the PMOSFET $P_1$ and comprising a second terminal coupled to a second predetermined voltage level $V_{SS}$. The output stage circuit $OS_2$ comprises: a PMOSFET $P_2$ comprising a first terminal coupled to the first predetermined voltage level $V_{DD}$ and comprising a second terminal coupled to the second terminal of the surge protecting device 203; and a NMOSFET $N_2$ comprising a first terminal coupled to the second terminal of the PMOSFET $P_1$ and comprising a second terminal coupled to the second predetermined voltage level $V_{SS}$. The control terminals for the NMOSFETs $N_1$, $N_2$ and the PMOSFETs $p_1$, $p_2$ receives signals from other signals from other devices inside the IC and the output stage circuits $OS_1$, $OS_2$ transmit them out.

Figure 3:
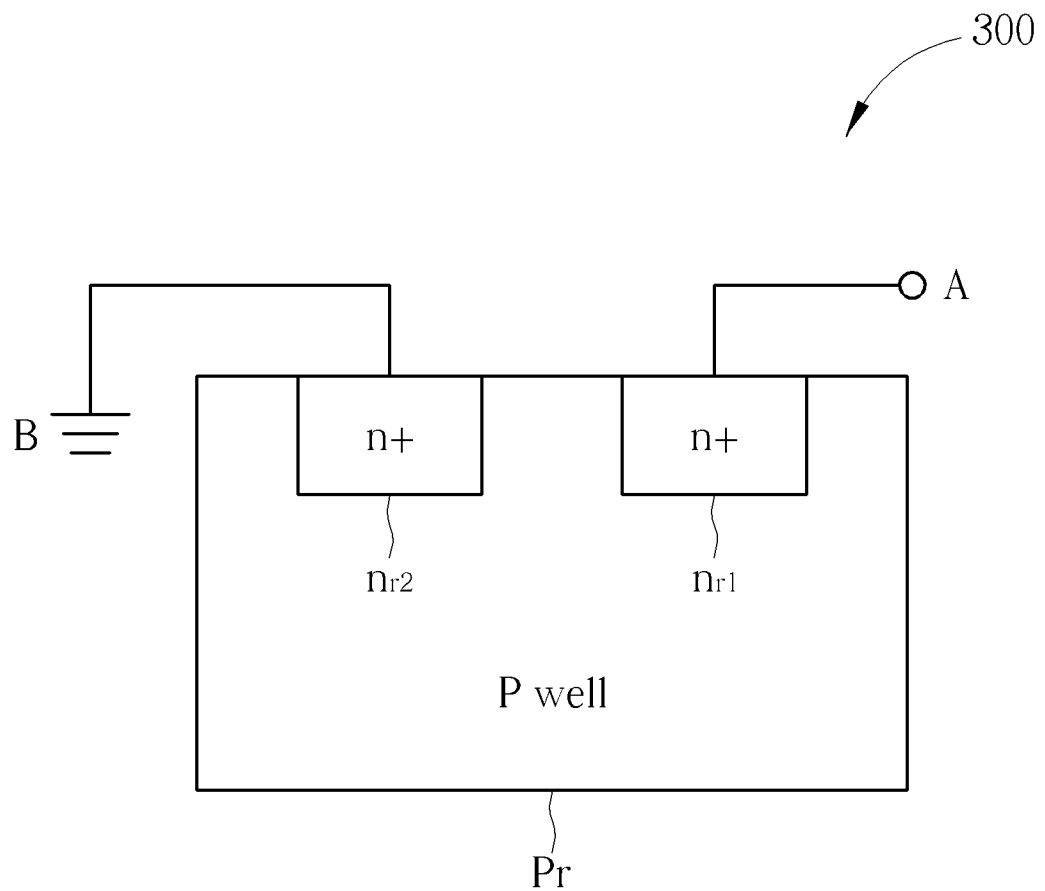
FIG. 3 is an example for a field oxide device.

Also, the surge protecting device 203 can comprise various kinds of structures. In one embodiment, the surge protecting device 203 is a silicon controlled rectifier (SCR), a MOS transistor or a field oxide device (FOD). A field oxide is a semiconductor device that can form a conductive path when a surge voltage occurs. FIG. 3 is an example for a field oxide device. As shown in FIG. 3, the field oxide device 300 comprises n-doped regions $n_{r1}$, $n_{r2}$, and a p-well region $P_r$. If a surge voltage occurs, a conductive path can be formed between the terminals A and B via the n-doped regions $n_{r1}$, $n_{r2}$ and the p-well region $P_r$. However, please note the field oxide device is not limited to the example illustrated in FIG. 3, other structures can reach the same function should also fall in the scope of the present application.

Figure 4:
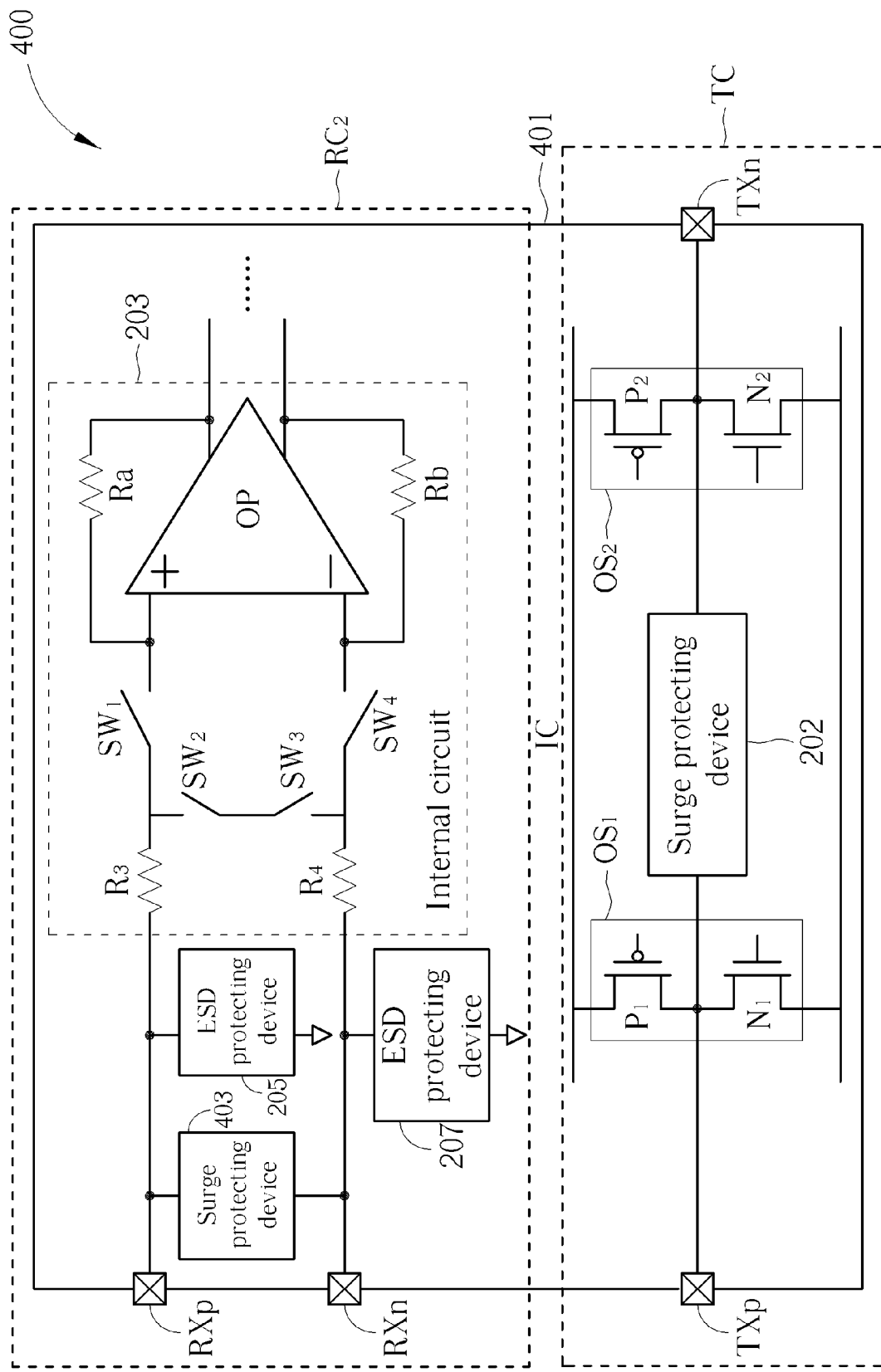
FIG. 4-6 are circuit diagrams illustrating signal transceiving circuits according to embodiments of the present application.
Figure 5:
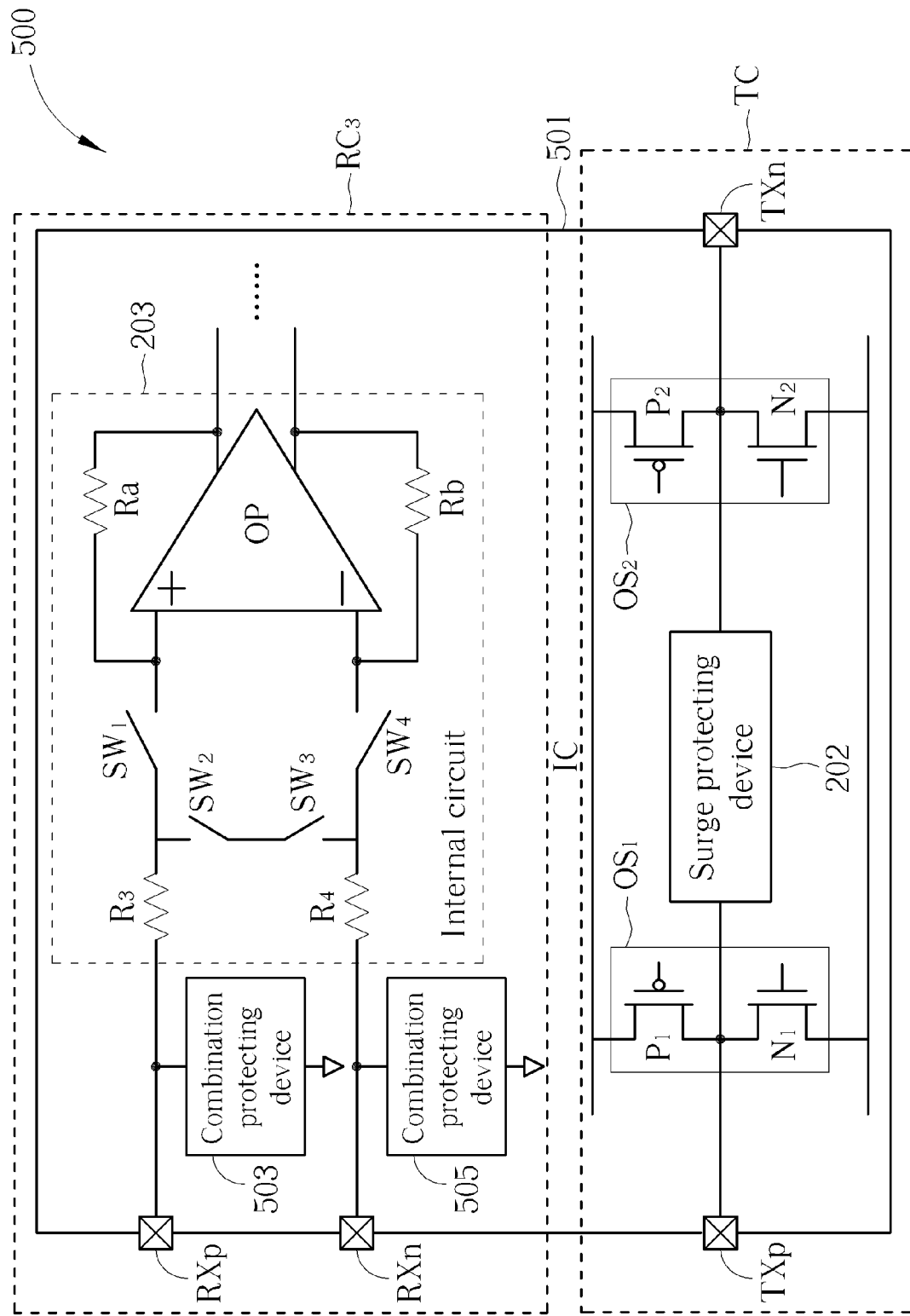
Figure 6:
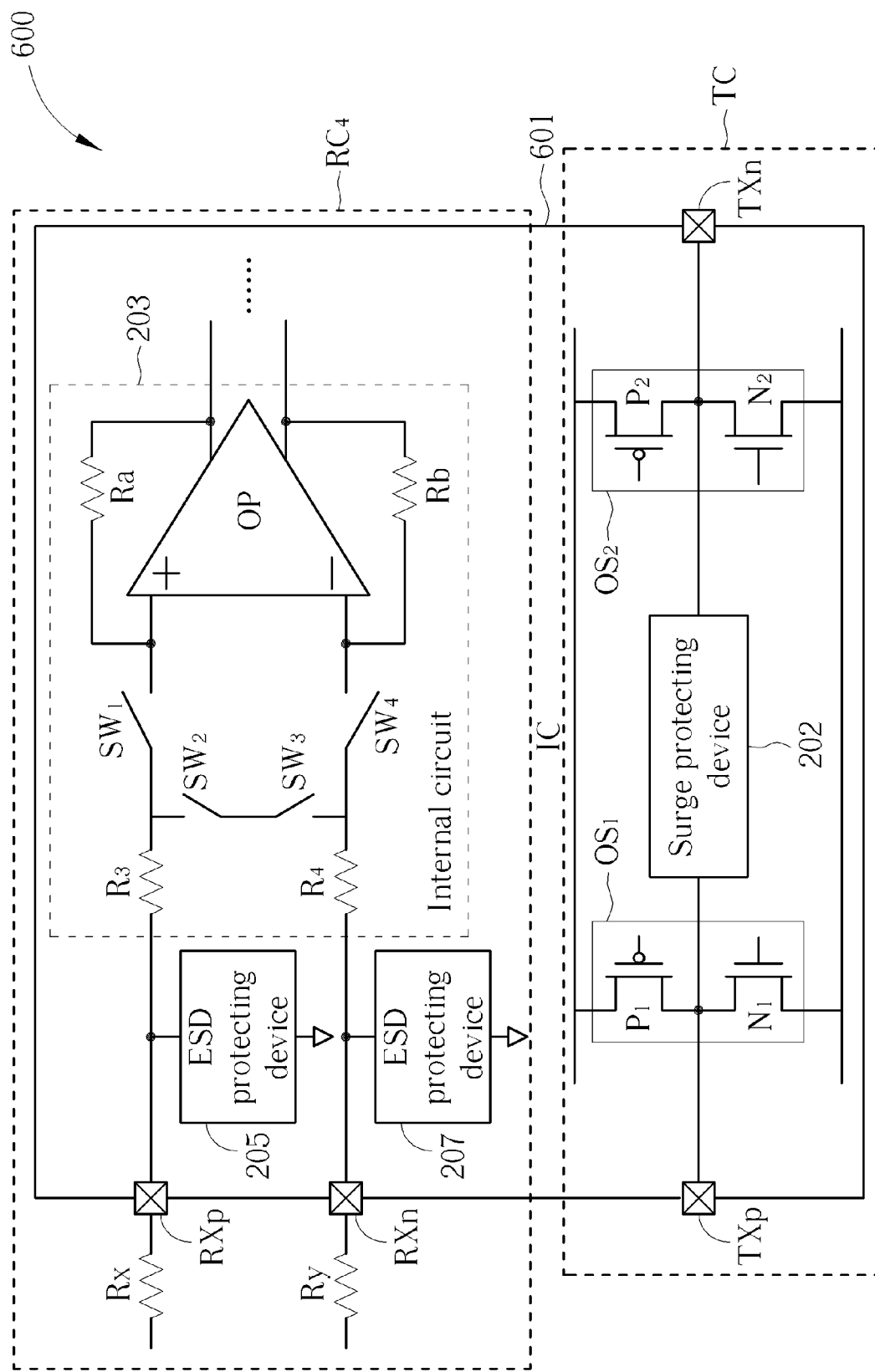

Embodiments for the signal receiving part according to the present application will be described below. In the following embodiments the signal transmitting part TC has the same structure as which in FIG. 2. Please note although the signal receiving parts in the following embodiments all receive a differential signal, but it can utilize only a signal path and only a signal path will be described for some embodiments since two signal paths have the same structures. The signal receiving part according to the embodiment of the present application can be summarized as a signal receiving circuit comprising an IC (ex. 201 in FIG. 2) and a surge protecting device. The IC comprises an internal circuit (ex. 203 in FIG. 2) and an ESD protecting device (ex. 205 in FIG. 2). If a surge voltage occurs, the surge protecting device receives and processes the surge voltage first to generate a processed surge voltage, and then the ESD protecting device receives and processes the processed surge voltage. The surge protecting device can be provided inside the IC or outside the IC. FIG. 2, FIG. 4, FIG. 5 illustrate the embodiments that the surge protecting device is inside the IC, and FIG. 6 illustrates the embodiment that the surge protecting device is outside the IC.

In FIG. 2, the surge protecting device is a resistance device $R_1$, which has a first terminal coupled to the I/O pad $RX_p$ and has a second terminal coupled to the ESD protecting device 205. The ESD protecting device 205 has a first terminal coupled the second terminal of the resistance device $R_1$ and a second terminal coupled to a ground voltage level. If a surge voltage occurs, the resistance device $R_1$ receives the surge voltage first from the I/O pad $RX_p$ and generates the processed surge voltage at the second terminal thereof. By this way, the ESD protecting device 205 receives and processes the processed surge voltage. The above explanation of FIG. 2 only explains one signal path of the signal receiving part $RC_1$. However, another signal path in the signal receiving part $RC_1$ also has the same structure. That is, another signal path comprises the I/O pad $RX_n$, the resistance device $R_2$, and the ESD protecting device 207, thus the explanation thereof is omitted for brevity here.

The internal circuit 203 is a circuit in an IC, thus it may has different structures for different types of ICs. In the embodiment of FIG. 2, the internal circuit 203 comprises resistance devices $R_3$, $R_4$ and an operational amplifier OP. The resistance devices $R_3$, $R_4$ have first terminals respectively coupled to second terminals of the resistance devices $R_1$, $R_2$, and have second terminals coupled to the operational amplifier OP. The internal circuit 203 can further comprise switches $SW_1$, $SW_2$, $SW_3$, $SW_4$ for sampling data, and resistance devices $R_a$, $R_b$ for adjusting gains. However, the structure shown in FIG. 2 is only for example and does not mean to limit the scope of the present application. The internal circuit can comprise any structure.

The surge protecting device can be replaced by other devices besides resistance devices. Also, the surge protecting device is not limited to be respectively provided to two signals paths. FIG. 4 is a circuit diagram illustrating a signal transceiving circuit 400 according to another embodiment of the present application. As shown in FIG. 4, the signal transceiving circuit 400 comprises an IC 401, which comprises a signal receiving part $RC_2$. The signal receiving part $RC_2$ comprises a surge protecting device 403 cross two signal paths. For more detail, the surge protecting device 403 has a first terminal coupled to the I/O pad $RX_p$, the first terminal of the ESD protecting device 205, and has a second terminal coupled to the I/O pad $RX_n$, the first terminal of the ESD protecting device 207. If a surge voltage occurs, the surge protecting device 403 receives the surge voltage first from the I/O pad $RX_p$ and generates the processed surge voltage at the second terminal therefore. By this way, the ESD protecting devices 205, 207 receive and process the processed surge voltage. Other detail structures for the signal transceiving circuit 400 are the same as which of the signal transceiving circuit 200, thus the explanation thereof is omitted for brevity here.

FIG. 5 is a circuit diagram illustrating a signal transceiving circuit 500 according to another embodiment of the present application. In the signal transceiving circuit 500, the ESD protecting device and the surge protecting device are incorporated into a combination protecting circuit. Therefore, the signal transceiving circuit 500 comprises an IC 501 having a signal receiving part $RC_3$. One signal path of the signal receiving part $RC_3$ has a combination protecting circuit 503 having a first terminal coupled to the I/O pad $RX_p$ and the internal circuit 203 and having a second terminal coupled to the ground voltage level. Another signal path of the signal receiving part $RC_3$ has a combination protecting circuit 505 having a first terminal coupled to the I/O pad $RX_n$ and the internal circuit 203 and having a second terminal coupled to the ground voltage level.

FIG. 6 is a circuit diagram illustrating a signal transceiving circuit 600 according to another embodiment of the present application. The signal transceiving circuit 600 has a similar structure as which of the signal transceiving circuit 200, but the surge protecting devices for the signal transceiving circuit 600 are provided outside the IC. Therefore, the signal transceiving circuit 600 comprises an IC 601 comprising a signal receiving part $RC_4$. The signal receiving part $RC_4$ also comprises, ESD protecting devices 205, 207, and an internal circuit 203, the same as the signal receiving part $RC_1$ in FIG. 2. The surge protecting devices for the signal transceiving circuit 600 are resistance devices $R_x$, $R_y$ provided outside the IC 601. The resistance device $R_x$ comprises a first terminal for receiving the surge voltage and comprises a second terminal coupled to the I/O pad $RX_p$. The resistance device $R_y$ comprises a first terminal for receiving the surge voltage and comprises a second terminal coupled to the I/O pad $RX_p$. The resistance device $R_y$ comprises a first terminal for receiving the surge voltage and comprises a second terminal coupled to the I/O pad $RX_n$. The operation for the signal receiving part $RC_4$ is similar as which of the signal receiving part $RC_1$, thus it is omitted for brevity here.

In view of above-mentioned embodiments, the surge protecting device having small sizes can be provided inside the IC or near the IC. Therefore, the issue for occupying board region can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal transceiving circuit, comprising:
   an IC including a signal transmitting part comprising:
   a first I/O pad;
   a second I/O pad;
   a first output stage circuit, coupled to the first I/O pad;
   a second output stage circuit, coupled to the second I/O pad;
   a first surge protecting device, comprising a first terminal coupled to the first output stage circuit and the first I/O pad, and comprising a second terminal coupled to the second output stage circuit and the second I/O pad;
   an internal circuit; and
   a first ESD protecting device; and
   a second surge protecting device;
   wherein the second surge protecting device, the internal circuit and the first ESD protecting device form a signal receiving part;
   wherein if a surge voltage occurs, the second surge protecting device receives and processes the surge voltage first to generate a processed surge voltage, and then the first ESD protecting device receives and processes the processed surge voltage.

2. The signal transceiving circuit of claim 1, wherein the first output stage circuit is a first output buffer and the second output stage circuit is a second output buffer.

3. The signal transceiving circuit of claim 2,
   wherein the first output stage circuit comprises:
   a first PMOSFET comprising a first terminal coupled to a first predetermined voltage level and comprising a second terminal coupled to the first terminal of the first surge protecting device; and
   a first NMOSFET comprising a first terminal coupled to the second terminal of the first PMOSFET and comprising a second terminal coupled to a second predetermined voltage level;
   wherein the second output stage circuit comprises:
   a second PMOSFET comprising a first terminal coupled to the first predetermined voltage level and comprising a second terminal coupled to the second terminal of the first surge protecting device; and
   a second NMOSFET comprising a first terminal coupled to the second terminal of the second PMOSFET and comprising a second terminal coupled to a second predetermined voltage level.

4. The signal transceiving circuit of claim 1, wherein the first surge protecting device is a silicon controlled rectifier or a field oxide device.

5. The signal transceiving circuit of claim 1, wherein the second surge protecting device is provided inside the IC.

6. The signal transceiving circuit of claim 5,
   wherein the IC has a third I/O pad;
   where the first ESD protecting device has a first terminal coupled to the internal circuit and a second terminal coupled to a ground voltage level;
   wherein the second surge protecting device is a resistance device having a first terminal coupled to the third I/O pad and a second terminal coupled to the first terminal of the first ESD protecting device.

7. The signal transceiving circuit of claim 5, further comprising a second ESD protecting device;
   wherein the IC comprises a third I/O pad and a fourth I/O pad;
   where the internal circuit comprises a first input terminal coupled to the first terminal of the first ESD protecting device and the third I/O pad, and comprises a second input terminal coupled to the fourth I/O pad and a first terminal of the second ESD protecting device;
   wherein the second surge protecting device comprises a first terminal coupled to the third I/O pad and a second terminal coupled to the fourth I/O pad.

8. The signal transceiving circuit of claim 5,
   wherein the IC has a third I/O pad;
   where the first ESD protecting device and the second surge protecting device are integrated to a protecting circuit;
   wherein the protecting circuit comprises a first terminal coupled to the third I/O pad and a second terminal coupled to a ground voltage level.

9. The signal transceiving circuit of claim 1, wherein the second surge protecting device is provided outside the IC.

10. The signal transceiving circuit of claim 9,
    wherein the IC has a third I/O pad;
    where the first ESD protecting device has a first terminal coupled to the internal circuit and a second terminal coupled to a ground voltage level;
    wherein the second surge protecting device is a resistance device having a first terminal for receiving the surge voltage and a second terminal coupled to the third I/O pad.

11. The signal transceiving circuit of claim 1, wherein the internal circuit comprises a resistance device and an operational amplifier, wherein the first ESD protecting device has a first terminal coupled to the internal circuit and a second terminal coupled to a ground voltage level, where the resistance device comprises a first terminal coupled to the first terminal of the first ESD protecting device and comprises a second terminal coupled to the operational amplifier.

12. A signal transceiving circuit, comprising:
    an IC including a signal transmitting part comprising:
    a first I/O pad;
    a second I/O pad;
    a first output stage circuit, coupled to the first I/O pad;
    a second output stage circuit, coupled to the second I/O pad; and
    a first surge protecting device, comprising a first terminal coupled to the first output stage circuit and the first I/O pad, and comprising a second terminal coupled to the second output stage circuit and the second I/O pad;
    wherein the first output stage circuit is a first output buffer and the second output stage circuit is a second output buffer.

13. The signal transceiving circuit of claim 12,
    wherein the first output stage circuit comprises:
    a first PMOSFET comprising a first terminal coupled to a first predetermined voltage level and comprising a second terminal coupled to the first terminal of the first surge protecting device; and
    a first NMOSFET comprising a first terminal coupled to the second terminal of the first PMOSFET and comprising a second terminal coupled to a second predetermined voltage level;
    wherein the second output stage circuit comprises:
    a second PMOSFET comprising a first terminal coupled to the first predetermined voltage level and comprising a second terminal coupled to the second terminal of the first surge protecting device; and
    a second NMOSFET comprising a first terminal coupled to the second terminal of the second PMOSFET and comprising a second terminal coupled to a second predetermined voltage level.

14. The signal transceiving circuit of claim 12, wherein the second surge protecting device is provided inside the IC.

15. The signal transceiving circuit of claim 14,
wherein the IC has a third I/O pad;
where the first ESD protecting device has a first terminal coupled to the internal circuit and a second terminal coupled to a ground voltage level;
wherein the second surge protecting device is a resistance device having a first terminal coupled to the third I/O pad and a second terminal coupled to the first terminal of the first ESD protecting device.

16. The signal transceiving circuit of claim 14, further comprising a second ESD protecting device;
wherein the IC comprises a third I/O pad and a fourth I/O pad;
where the internal circuit comprises a first input terminal coupled to the first terminal of the first ESD protecting device and the third I/O pad, and comprises a second input terminal coupled to the fourth I/O pad and a first terminal of the second ESD protecting device;
wherein the second surge protecting device comprises a first terminal coupled to the third I/O pad and a second terminal coupled to the fourth I/O pad.

17. The signal transceiving circuit of claim 14,
wherein the IC has a third I/O pad;
where the first ESD protecting device and the second surge protecting device are integrated to a protecting circuit;
wherein the protecting circuit comprises a first terminal coupled to the third I/O pad and a second terminal coupled to a ground voltage level.

18. The signal transceiving circuit of claim 12, wherein the second surge protecting device is provided outside the IC.

19. The signal transceiving circuit of claim 18,
wherein the IC has a third I/O pad;
where the first ESD protecting device has a first terminal coupled to the internal circuit and a second terminal coupled to a ground voltage level;
wherein the second surge protecting device is a resistance device having a first terminal for receiving the surge voltage and a second terminal coupled to the third I/O pad.

20. The signal transceiving circuit of claim 12, wherein the internal circuit comprises a resistance device and an operational amplifier, wherein the first ESD protecting device has a first terminal coupled to the internal circuit and a second terminal coupled to a ground voltage level, where the resistance device comprises a first terminal coupled to the first terminal of the first ESD protecting device and comprises a second terminal coupled to the operational amplifier.

* * * * *